(12) United States Patent
Ichimaru

(10) Patent No.: US 6,700,449 B2
(45) Date of Patent: Mar. 2, 2004

(54) SAW OSCILLATION CIRCUIT

(75) Inventor: Kouzou Ichimaru, Kunisaki Higashikunisaki Gun (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/256,175

(22) Filed: Sep. 26, 2002

(65) Prior Publication Data
US 2003/0076186 A1 Apr. 24, 2003

(30) Foreign Application Priority Data
Oct. 18, 2001 (JP) ..................................... 2001-320719

(51) Int. Cl.[7] .............................. H03L 7/00; H03B 5/12
(52) U.S. Cl. ..................... 331/107 A; 331/74; 331/175; 331/176; 310/313 B; 332/103; 332/144
(58) Field of Search ............................ 331/74, 107 A, 331/107 DP, 19, 175, 176, 66; 332/103, 112, 144; 327/105, 106; 310/313 B

(56) References Cited
U.S. PATENT DOCUMENTS
5,748,047 A * 5/1998 Guthrie et al. ................ 331/19
5,770,977 A * 6/1998 Uurtamo ...................... 331/40

* cited by examiner

Primary Examiner—Arnold Kinkead
(74) Attorney, Agent, or Firm—W. Daniel Swayze, Jr.; W. James Brady; Frederick J. Telecky, Jr.

(57) ABSTRACT

An oscillation circuit uses a SAW oscillator and is able to control the oscillation frequency easily and correct the temperature characteristic of the oscillator so that an oscillation signal with high temperature stability can be generated. A clock signal CLK having a prescribed frequency difference from the ideal oscillation frequency is generated by the SAW oscillator 10. Register 30 is driven by a frequency-divided clock signal obtained by dividing the frequency of the clock signal at a predetermined frequency division rate. In-phase signal $S_I$ and quadrature signal $S_Q$ generated corresponding to the data Da that is incremented by a prescribed addition value F every period of the frequency-divided clock signal are output, and the clock signal is IQ-modulated on the basis of these signals. The frequency error of clock signal CLK can be corrected, and an output signal $S_{out}$ having near ideal oscillation frequency can be obtained.

5 Claims, 2 Drawing Sheets

SAW OSCILLATION CIRCUIT

FIELD OF THE INVENTION

The present invention pertains to an oscillation circuit, such as an oscillation circuit using a SAW (Surface Acoustic Wave) resonator.

BACKGROUND OF THE INVENTION

Oscillation circuits using SAW oscillators can restrain phase noise (also known as jitter) to a low level. They can realize excellent phase noise characteristics compared to other oscillation circuits. Also, since SAW resonators exhibit strong mechanical vibration and the oscillation frequency is hardly affected by outside mechanical impact, they are widely used in portable communication terminals, such as mobile phones.

In oscillation circuits using SAW oscillators, however, it is difficult to adjust the structural oscillation frequency of the element. For example, even if the load capacitance of the oscillation circuit using a SAW oscillator changes, the range of variation of its oscillation frequency will be narrow. Consequently, if the oscillation frequency of the SAW oscillator is controlled by adjusting the load capacitance, the controllable frequency range becomes very narrow.

Also, since the oscillation frequency of the SAW oscillator changes significantly with ambient temperature, it is necessary to use a temperature-compensation circuit in order to provide a stable oscillation signal.

The objective of the present invention is to solve the problems by providing an oscillation circuit that uses a SAW oscillator, which is able to control the oscillation frequency easily and correct the temperature characteristic of the oscillator so that a stable oscillation signal unaffected by high temperatures can be generated.

SUMMARY OF THE INVENTION

In order to realize the objective, the first oscillation circuit of the present invention comprises an oscillator that outputs an oscillation signal, a frequency divider that frequency-divides the oscillation signal at a prescribed frequency division value and outputs a frequency-divided signal, a data retention circuit that receives input data corresponding to the frequency-divided signal and retains the input data, an adder that adds the retained data output from the data retention circuit to a prescribed addition value and outputs the result to the data retention circuit, a quadrature signal generating circuit that outputs first and second signals in quadrature corresponding to the retained data, and a modulation circuit that modulates the oscillation signal corresponding to the first and second signals and outputs an output signal shifted by as much as the frequency of the quadrature signal.

The second oscillation circuit of the present invention comprises an oscillator that outputs an oscillation signal, a frequency divider that frequency-divides the oscillation signal at a prescribed frequency division value and outputs a frequency-divided signal, a data retention circuit that receives input data corresponding to the frequency-divided signal and retains the input data, a temperature sensor for detecting temperature, a correction data generating circuit that generates correction data with respect to the oscillation signal corresponding to the temperature detected by the temperature sensor, an adder that adds the retained data output from the data retention circuit to the correction data and outputs the result to the data retention circuit, a quadrature signal generating circuit that outputs first and second signals in quadrature corresponding to the retained data, and a modulation circuit that modulates the oscillation signal corresponding to the first and second signals and outputs an output signal shifted by as much as the frequency of the quadrature signal.

Also, in the present invention, the adder may output the sum except for the carry signal to the data retention circuit.

In addition, in the present invention, the modulation circuit phase may modulate the oscillation signal corresponding to the first and second signals.

Moreover, in the present invention, the oscillator may be a SAW oscillator, and the modulation circuit may be an IQ modulator.

DESCRIPTION OF THE EMBODIMENTS

Figure 1:
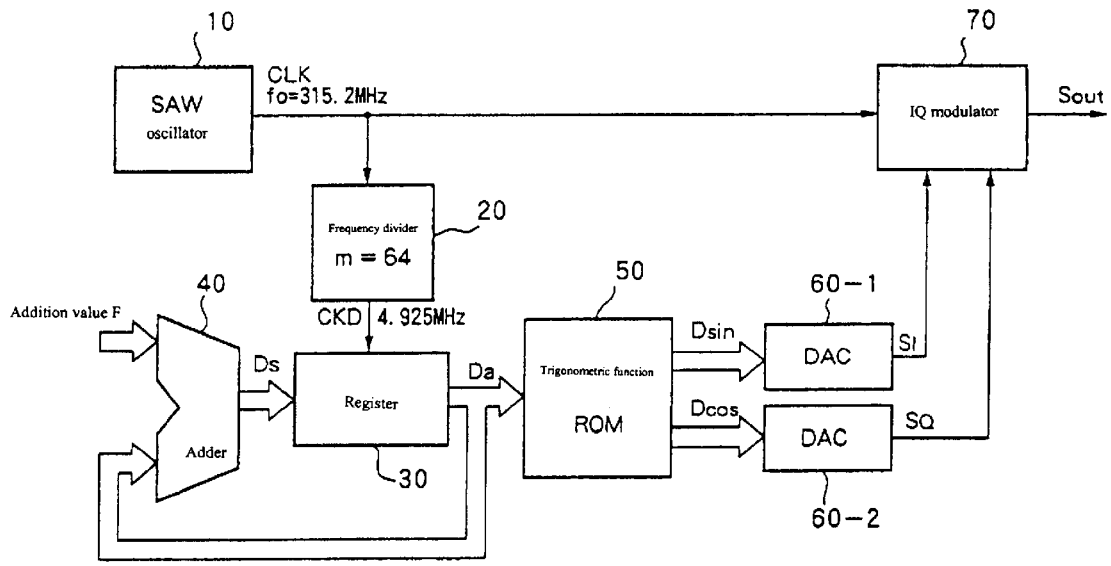
FIG. 1 is a circuit diagram illustrating the first embodiment of the oscillation circuit disclosed in the present invention.

FIG. 1 is a circuit diagram illustrating the first embodiment of the oscillation circuit disclosed in the present invention.

As shown in the figure, the oscillation circuit of the present embodiment comprises SAW oscillator 10, frequency divider 20, register 30, adder 40, trigonometric function ROM 50, D/A converters (DAC) 60-1, 60-2, and IQ modulator 70.

Each part of the oscillation circuit disclosed in the present embodiment will be explained below.

SAW oscillator 10 oscillates at a prescribed oscillation frequency to output a clock signal CLK. Clock signal CLK is supplied to frequency divider 20 and IQ modulator 70.

Frequency divider 20 divides the frequency of clock signal CLK at a preset frequency division rate m to output a frequency-divided clock signal CKD. For example, when the frequency $f_0$ of the clock signal CLK output by SAW oscillator 10 is 315.2 MHz and the frequency division rate m of frequency divider 20 is 64, the frequency $f_d$ of the frequency-divided clock signal CKD is 315.2/64=4.925 MHz. The frequency-divided clock signal CKD is supplied to register 30.

Register 30 is driven by frequency-divided clock signal CKD. That is, register 30 receives the output data $D_s$ of adder 40 every period of frequency-divided clock signal CKD, retains the received data until the next data reception cycle, and outputs the data to trigonometric function ROM 50 and adder 40. In FIG. 1, for the sake of clarity, the data output from adder 40 to register 30 are represented by $D_s$, while the data output from register 30 are represented by $D_a$.

Adder 40 calculates the sum $D_s$ of the addition value F output from the outside and the output data $D_a$ of register 30 and outputs the result to register 30. In other words, the output data $D_s$ of adder 40 is calculated as follows on the basis of the addition value F input to adder 40 and the output data $D_a$ of register 30.

[Equation 1]

$$D_s = F + D_a \ldots \quad (1)$$

In this case, for example, adder 40 has a data width of 12 bits. That is, the output data $D_s$ of adder 40 can range from 0 to 4095. If the calculation result of adder 40 exceeds the maximum value of 4095, that is, if so-called overflow occurs, the carry data is discarded, and the adding result becomes the rest of the lower bits. Consequently, a 12-bit adding data $D_s$ incremented by as much as the addition value F every period of frequency-divided clock signal CKD is obtained by register 30 and adder 40. The adding Data $D_s$ is repeated between the minimum value of 0 and the maximum value of 4095.

Similarly, register 30 also has a 12-bit data width. The 12-bit adding data $D_s$ are input sequentially to register 30 and output to adder 40 and trigonometric function ROM 50 with the timing of frequency-divided clock signal CKD.

Trigonometric function ROM 50 outputs SIN function value $D_{sin}$ and COS function value $D_{cos}$ of the angle converted from output data $D_a$ corresponding to the output data $D_a$ of register 30. For example, the output data Da of register 30 is 12-bit data, and $2^{12}=4096$ corresponds to 360°. The angle θ corresponding to any output data Da is derived from the following equation.

[Equation 2]

$$\theta = 360 D_a / 4096 \ldots \quad (2)$$

The SIN function value $D_{sin}$ and COS function value $D_{cos}$ corresponding to angle θ derived from equation (2) can be calculated as follows.

[Equation 3]

$$D_{sin} = \sin\theta$$
$$D_{cos} = \cos\theta \ldots \quad (3)$$

In an actual oscillation circuit, the SIN function value and the COS function value can be calculated according to equations (2) and (3) in each cycle corresponding to the output data $D_a$ of register (30). However, in the oscillation circuit of the present embodiment shown in FIG. 1, the SIN function values and the COS function values corresponding to all of the output data $D_a$ are calculated in advance, and a table of SIN functions and COS functions is formed and stored in trigonometric function ROM 50. In this way, the SIN function value and the COS function value can be read from trigonometric function ROM 50 without performing calculations each cycle corresponding to the output data $D_a$ of register 30.

DAC 60-1 and DAC 60-2 convert the SIN function value $D_{sin}$ and the COS function value $D_{cos}$ read from trigonometric function ROM 50 into analog signals. The SIN function value $D_{sin}$ is converted into an analog signal to obtain in-phase signal $S_I$. The COS function value $D_{cos}$ is converted into an analog signal to obtain quadrature signal $S_Q$. In-phase signal $S_I$ and quadrature signal $S_Q$ are supplied to IQ modulator 70.

IQ modulator 70 performs IQ modulation, that is, the clock signal CLK output from SAW oscillator 10 is phase-modulated on the basis of in-phase signal $S_I$ and quadrature signal $S_Q$ supplied from DAC 60-1 and DAC 60-2, respectively. As a result of the phase modulation performed by IQ modulator 70, the phase (frequency) of the input clock signal CLK is adjusted on the basis of in-phase signal $S_I$ and quadrature signal $S_Q$. That is, the frequency of the clock signal CLK generated by SAW oscillator 10 can be adjusted by phase-modulating the clock signal CLK with IQ modulator 70.

In the following, the frequency adjustment of the oscillation circuit disclosed in the present embodiment will be explained with reference to specific values.

For example, if the ideal oscillation frequency is f=315 MHz, while the actual oscillation frequency of SAW oscillator 10 is $f_0$=315.2 MHz, the oscillation circuit of the present embodiment will adjust the oscillation frequency of 315.2 MHz of SAW oscillator 10 to output an oscillation signal with the ideal oscillation frequency of 315 MHz.

The frequency $f_d$ of frequency-divided clock signal CKD output from frequency divider 20 is 315.2 MHz/64=4.925 MHz. Since frequency-divided clock signal CKD is output to register 30, register 30 receives the output data $D_s$ of adder 40 every period of the frequency-divided clock signal CKD and outputs the data to trigonometric function ROM 50, while feeding it back to adder 40.

The addition value F input to adder 40 is calculated as follows corresponding to the maximum value $D_{max}$ of register 30 and adder 40, the difference Δf between the oscillation frequency $f_0$ of the SAW oscillator and the desired frequency f, and the frequency $f_d$ of frequency-divided clock signal CKD.

[Equation 4]

$$F = D_{max} \cdot \Delta f / f_d \ldots \quad (4)$$

In this case, register 30 and adder 40 have a 12-bit data width. Also, Δf=$f_0$·f=(315.2−315) MHz=0.2 MHz, $f_d$=4.925 MHz. According to equation (4), the addition value F is calculated as F=4096×0.2/4.925≈1.66.

In other words, if an addition value F=166 is input to adder 40, the difference between the oscillation frequency of SAW oscillator 10 and the ideal oscillation frequency can be corrected. This will be explained below.

Data $D_a$ incremented by F every period of the frequency-divided clock signal CKD is output from register 30. The addition result $D_a$ is input to trigonometric function ROM 50, and the corresponding SIN function value Dsin and COS function value $D_{cos}$ are output. In-phase signal $S_I$ and quadrature signal $S_Q$ corresponding to SIN function value $D_{sin}$ and COS function value $D_{cos}$ are output by DAC 60-1 and DAC 60-2, respectively.

The frequency $f_a$ of in-phase signal $S_I$ and quadrature signal $S_Q$ can be calculated as follows from addition value F, the maximum value $D_{max}$ of data $D_a$, and the frequency $f_d$ of the frequency-divided clock signal CKD.

[Equation 5]

$$F_a = F \cdot F_d / D_{max} \ldots \quad (5)$$

Since F=166, $f_d$=4.925 MHz, and $D_{max}$=4096, frequency $f_a$ becomes 199.6 kHz according to equation (5). An oscillation signal with frequency shifted by as much as $f_a$ is obtained as a result of using IQ modulator 70 to phase-modulate for clock signal CLK on the basis of in-phase signal $S_I$ and quadrature signal $S_Q$. In other words, the frequency of the output signal $S_{out}$ of IQ modulator 70 will be 315.2 MHz−199.6 kHz=315.004 MHz.

By using the oscillator disclosed in the present embodiment, when the addition value F input to adder (40) is set appropriately to correspond to the shift in the oscillation frequency of SAW oscillator (10), the oscillation frequency can be converted, and a clock signal with the desired oscillation frequency can be generated.

The example described above is an example of correction when the oscillation frequency of SAW oscillator 10 is higher than the ideal value by 200 kHz. However, the oscillation circuit of the present embodiment is able to correct any frequency difference by setting an appropriate addition value F. For example, if the oscillation frequency of SAW oscillator 10 is below the ideal value by 200 kHz, if the addition value input to adder 40 is 4096−166=3930, the frequency of in-phase signal $S_I$ and quadrature signal $S_Q$ generated corresponding to the SIN function value and COS function value output by trigonometric function ROM 50 is −199.6 kHz. As a result, an oscillation signal with the oscillation frequency of SAW oscillator 10 shifted higher by 199.6 kHz is obtained by IQ modulator 70.

As explained above, according to the present embodiment, a clock signal CLK having a prescribed frequency difference from the ideal oscillation frequency is generated by SAW oscillator 10. Register 30 is driven by a frequency-divided clock signal obtained by dividing the frequency of the clock signal by a prescribed frequency division rate. In-phase signal $S_I$ and quadrature signal $S_Q$ generated corresponding to the data $D_a$ that is incremented by a prescribed addition value F every period of the frequency-divided clock signal are output, and the clock signal is IQ-modulated on the basis of these signals. In this way, the frequency error of clock signal CLK can be corrected, and an output signal $S_{out}$ having the ideal oscillation frequency can be obtained.

Figure 2:
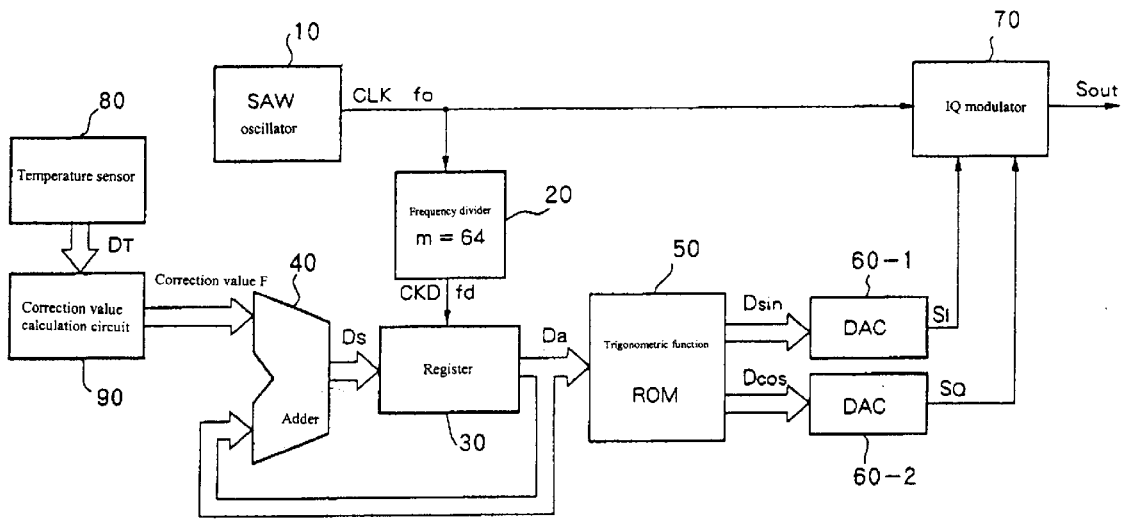
FIG. 2 is a circuit diagram illustrating the second embodiment of the oscillation circuit disclosed in the present invention.

FIG. 2 is a circuit diagram illustrating a second embodiment of the oscillation circuit disclosed in the present invention.

As shown in the figure, temperature sensor 80 and correction value calculating circuit 90 are added to the oscillation circuit disclosed in the first embodiment. In other words, in the present embodiment, except for temperature sensor 80 and correction value calculation circuit 90, the other constituent parts are almost the same as the constituent parts of the oscillation circuit disclosed in the first embodiment. Consequently, the parts in FIG. 2 identical to those in FIG. 1 are represented by the same respective symbols.

The oscillation circuit of the present embodiment can supply a highly stable oscillation signal independent of the change in temperature by correcting the difference of the oscillation frequency of SAW oscillator 10 corresponding to the ambient temperature of the oscillation circuit.

SAW oscillators can supply an oscillation signal with stable frequency and low frequency noise. On the other hand, the temperature characteristic of said oscillators is such that the oscillation frequency varies significantly due to the change in temperature. For example, an oscillator has a temperature characteristic of around 100 ppm ($10^{-6}$) or higher corresponding to a change in ambient temperature. Consequently, in order to provide frequency stable oscillation signal that is independent of the change in temperature, it is necessary to adopt a temperature correction circuit for the SAW oscillator.

As shown in FIG. 2, in the oscillation circuit of the present embodiment, by adopting temperature sensor 80 and correction value calculating circuit 90, the ambient temperature of the oscillation circuit can be detected, and a correction value F for correcting the oscillation frequency of the SAW oscillator can be calculated on the basis of the ambient temperature and the given temperature characteristic of the SAW oscillator. When IQ modulation is performed on the output clock signal CLK of the SAW oscillator on the basis of the correction value, the change in the oscillation frequency caused by the change in temperature can be provided, and stable oscillation signal with almost no temperature-dependence can be provided.

In the following, the configuration and operation of the oscillation circuit disclosed in the present embodiment will be explained.

Temperature sensor 80 measures the ambient temperature of the oscillation circuit and outputs temperature data $D_T$ corresponding to the ambient temperature.

Correction value calculation circuit 90 calculates the correction value F for correcting the oscillation frequency of SAW oscillator 10 corresponding to the temperature data $D_T$ obtained from temperature sensor 80 and outputs the result to adder 40.

The temperature characteristic of SAW oscillator 10 is provided by pre-measurement. According to the temperature characteristic, the oscillation frequency $f_0$ of SAW oscillator 10 at the current ambient temperature can be determined. Since the error $\Delta f$ between the current oscillation frequency $f_0$ and the ideal oscillation frequency can be derived, according to the frequency-correction theory described in the first embodiment, correction value F can be calculated by correction value calculation circuit 90 and output to adder 40.

Figure 3:
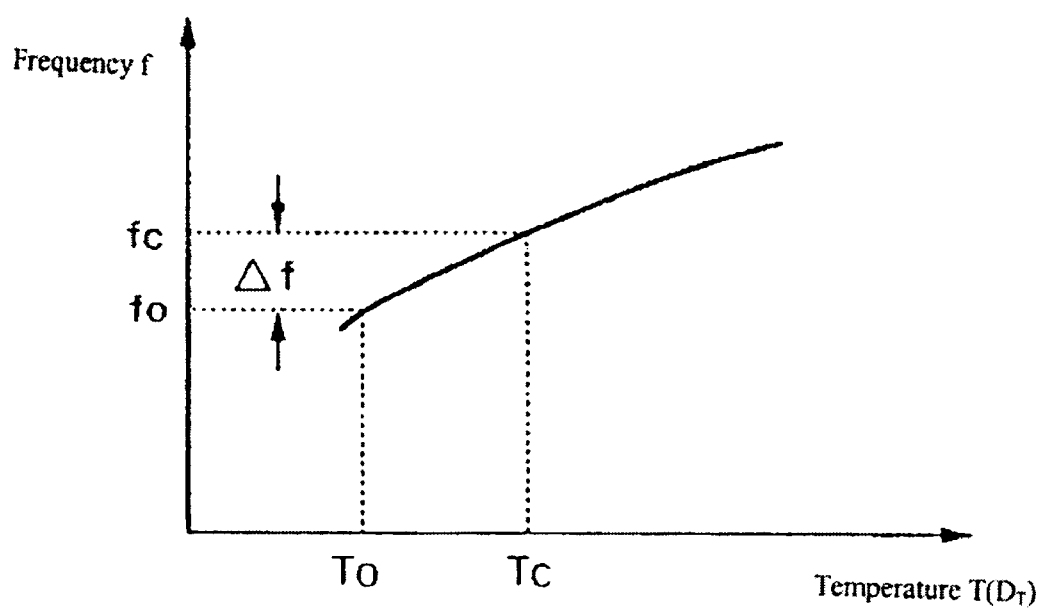
FIG. 3 is a diagram illustrating an example of the temperature characteristic of a SAW oscillator.

For example, SAW oscillator 10 has the temperature characteristic shown in FIG. 3. $f_c$ is the oscillation frequency at temperature $T_c$. Ideally, the oscillation frequency of SAW oscillator 10 stays at $f_c$ independent of the change in temperature. Actually, however, the oscillation frequency varies with temperature T as shown by the curve in FIG. 3.

In correction value calculating circuit 90, first, the oscillation frequency deviation $\Delta f$ at the current ambient temperature $T_0$ can be obtained according to temperature data $D_T$ detected by temperature sensor 80. Then, correction value F can be calculated on the basis of frequency deviation $\Delta f$ according to said equation (4). If correction value calculation circuit 90 outputs the calculated correction value to adder 40, in-phase signal $S_I$ and quadrature signal $S_Q$ for correcting the frequency deviation $\Delta f$ caused by the change in temperature can be generated. As a result of the phase modulation performed by IQ modulator 70 on clock signal CLK, the frequency deviation can be corrected, and an oscillation signal $S_{out}$ having the ideal frequency $f_c$ is output.

In the oscillation circuit of the present embodiment, besides using an operation means, such as a CPU, correction value calculation circuit 90 can store a table of the calculated correction values F corresponding to temperature data $D_T$ in memory, such as a ROM, in advance and then read the correction value F from the ROM based on the temperature data $D_T$ measured by temperature sensor 80 and send it to adder 40. In this way, the correction value can be easily obtained without the need to use a CPU or other operation means or to write a program for the calculation.

As explained above, according to the present embodiment, temperature data $D_T$ corresponding to the ambient temperature is measured by temperature sensor 80. The correction value F corresponding to the temperature data is calculated with correction value calculating circuit 90 and is output to adder 40. Then, the in-phase signal $S_I$ and quadrature signal $S_Q$ for correcting the oscillation frequency deviation of SAW oscillator 10 caused by the change in temperature are generated corresponding to the correction value F. By using IQ modulator 70, the frequency deviation of the output clock signal CLK of SAW oscillator 10 can be corrected, and oscillation signal $S_{out}$ with high temperature stability, independent of the change in temperature can be output.

As explained above, according to the present invention, a correction value set corresponding to the frequency deviation of a SAW oscillator is used to generate the quadrature signal and the in-phase signal used for frequency correction. Therefore, it is possible to provide an oscillation signal having the desired oscillation frequency by correcting the oscillation frequency depending on IQ modulation conducted on the basis of these signals.

Also, according to the present invention, the ambient temperature of an oscillation circuit can be measured with a temperature sensor to obtain temperature data. Then, the oscillation circuit deviation of the SAW oscillator is derived on the basis of the temperature data, and a correction value is calculated corresponding to the temperature data. The calculated correction value is used to correct the frequency of the output signal of the SAW oscillator. In this way, the oscillation frequency deviation caused by the change in the temperature can be corrected, and an oscillation signal with stable oscillation frequency independent of the change in temperature can be provided.

What is claimed is:

1. An oscillation circuit comprising:
    an oscillator that outputs an oscillation signal,
    a frequency divider that frequency-divides the oscillation signal at a predetermined frequency division value and outputs a frequency-divided signal,
    a data retention circuit that receives input data corresponding to the frequency-divided signal and retains the input data, an adder that adds a retained data output from the data retention circuit to a predetermined addition value and outputs the result to a data retention circuit, a quadrature signal generating circuit that outputs first and second signals in quadrature corresponding to the retained data output, and a modulation circuit that modulates the oscillation signal corresponding to the first and second signals and outputs an output signal shifted by as much as a frequency of the quadrature signal.

2. An oscillation circuit comprising:

an oscillator that outputs an oscillation signal, a frequency divider that frequency-divides the oscillation signal at a predetermined frequency division value and outputs a frequency-divided signal, a data retention circuit that receives input data corresponding to the frequency-divided signal and retains the input data, a temperature sensor for detecting temperature, a correction data generating circuit that generates correction data with respect to the oscillation signal corresponding to the temperature detected by the temperature sensor, an adder that adds a retained data output from the data retention circuit to the correction data and outputs the result to the data retention circuit, a quadrature signal generating circuit that outputs first and second signals in quadrature corresponding to the retained data output, and a modulation circuit that modulates the oscillation signal corresponding to the first and second signals and outputs an output signal shifted by as much as a frequency of the quadrature signal.

3. The oscillation circuit in claim 1 wherein the adder outputs the sum except for a carry signal to the data retention circuit.

4. The oscillation circuit described in claim 1 wherein the modulation circuit phase-modulates the oscillation signal corresponding to the first and second signals.

5. The oscillation circuit described in claim 1 wherein the oscillator is a SAW oscillator, and the modulation circuit is an IQ modulator.

* * * * *